United States Patent
Krivokapic (10) Patent No.: US 8,102,000 B2
(45) Date of Patent: Jan. 24, 2012

(54) P-CHANNEL GERMANIUM ON INSULATOR (GOI) ONE TRANSISTOR MEMORY CELL

(75) Inventor: Zoran Krivokapic, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 130 days.

(21) Appl. No.: 12/082,637

(22) Filed: Apr. 10, 2008

(65) Prior Publication Data

US 2009/0256206 A1    Oct. 15, 2009

(51) Int. Cl.
*H01L 29/49* (2006.01)

(52) U.S. Cl. .......... 257/354; 257/347; 257/E29.151; 257/E29.297; 257/E21.411; 257/289; 438/151; 438/197

(58) Field of Classification Search .......... 257/68–71, 257/296–347, 905–908, E27.084–E27.097, 257/E27.075
See application file for complete search history.

(56) References Cited

U.S. PATENT DOCUMENTS

| 6,501,135 | B1 | 12/2002 | Krivokapic |
| 2006/0125010 | A1* | 6/2006 | Bhattacharyya ............. 257/347 |
| 2008/0217711 | A1* | 9/2008 | Sugiyama et al. ........... 257/421 |

* cited by examiner

*Primary Examiner* — N Drew Richards
*Assistant Examiner* — Mamadou Diallo
(74) *Attorney, Agent, or Firm* — Farjami & Farjami LLP (57) ABSTRACT

According to one exemplary embodiment, a p-channel germanium on insulator (GOI) one transistor memory cell comprises a buried oxide (BOX) layer formed over a bulk substrate, and a gate formed over a gate dielectric layer situated over a germanium layer formed over the buried oxide (BOX) layer. A source region is formed in the germanium layer adjacent to a channel region underlying the gate and overlaying the BOX layer, and a drain region is formed in the germanium layer adjacent to the channel region. The source region and the drain region are implanted with a p-type dopant. In one embodiment, a p-channel GOI one transistor memory cell is implemented as a capacitorless dynamic random access memory (DRAM) cell. In one embodiment, a plurality of p-channel GOI one transistor memory cells are included in a memory array.

14 Claims, 8 Drawing Sheets

P-CHANNEL GERMANIUM ON INSULATOR (GOI) ONE TRANSISTOR MEMORY CELL

TECHNICAL FIELD

The present invention is generally in the field of semiconductor devices. More particularly, the invention is in the field of semiconductor on insulator (SOI) devices.

BACKGROUND ART

Dynamic random access memory (DRAM) is a widely utilized type of high density volatile memory. In the ongoing effort to achieve ever higher memory densities, a one transistor DRAM cell has been developed. In one approach, an individual memory cell is provided on a silicon on insulator (SOI) substrate that includes only a single transistor, and does not include a capacitor. This type of DRAM cell, also known as a capacitorless DRAM cell because it does not require a capacitor, and is commonly implemented as an n-channel silicon on insulator device.

The n-channel silicon on insulator one transistor DRAM cells in general use typically include a gate situated over the channel region of the transistor in which minority charge carriers (holes in the case of an n-channel device) are sequestered in the channel during programming. The one transistor DRAM cell can be programmed to a logic "1" or a logic "0" by appropriately biasing the gate, the semiconductor substrate underlying the buried oxide (BOX) layer contributing to electrical isolation of the channel, and the doped silicon source and drain regions of the DRAM cell. As a result of the programming operation, the accumulated holes in the channel float and remain in the channel since the underlying layer is an insulator. The effect of the accumulated and floating holes in the channel is to change the threshold voltage of the transistor, thus indicating that the transistor has been programmed. A read operation may be performed by sensing the gate voltage or the drain current to determine if the one transistor DRAM cell is programmed as a logic "1" or a logic "0."

The difference in gate voltage or drain current between a logic "1" and a logic "0" may be referred to as the sensing margin of the one transistor DRAM cell. In the silicon on insulator one transistor DRAM cells commonly in use today, the sensing margin is generally considered to be too low. One conventional approach to compensate for the low sensing margins seen in present silicon on insulator one transistor DRAM cells requires complicated sensing circuitry to distinguish a logic "1" from a logic "0" A significant drawback of this approach, however, is that providing the sensing circuitry can undesirably increase manufacturing cost.

Another conventional approach to the problem of low sensing margins in silicon on insulator one transistor DRAM cells, requires application of high biasing voltages, when compared to operational voltages applied to logic devices that may be co-located on a semiconductor die. Those logic devices may have operating voltages of approximately 1.0 V, while as much as approximately 2.4V may be required to produce adequate sensing margins in the silicon on insulator one transistor memory cells. Consequently this second approach imposes several significant disadvantages as well. First, the one transistor memory cells operating under these elevated biasing conditions are working at or near their voltage limits, making device reliability an issue. Secondly, the elevated voltages required to program the memory cells are potentially damaging to logic devices sharing the semiconductor die, requiring separate voltage sources and separate metal lines for application of the higher voltages to the memory cells. In addition, the elevated voltages required by conventional silicon on insulator one transistor memory cells may require the use of charge pumps to sustain the high biasing voltages, adding further to the complexity and the cost of this conventional solution.

Thus, there is a need in the art to overcome the drawbacks and deficiencies of the conventional one transistor memory cell.

SUMMARY

A p-channel germanium on insulator (GOI) one transistor memory cell, substantially as shown in and/or described in connection with at least one of the figures, and as set forth more completely in the claims.

DETAILED DESCRIPTION OF THE INVENTION

The present invention is directed to a p-channel germanium on insulator (GOI) one transistor memory cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures are indicated by like or corresponding reference numerals.

Figure 1:
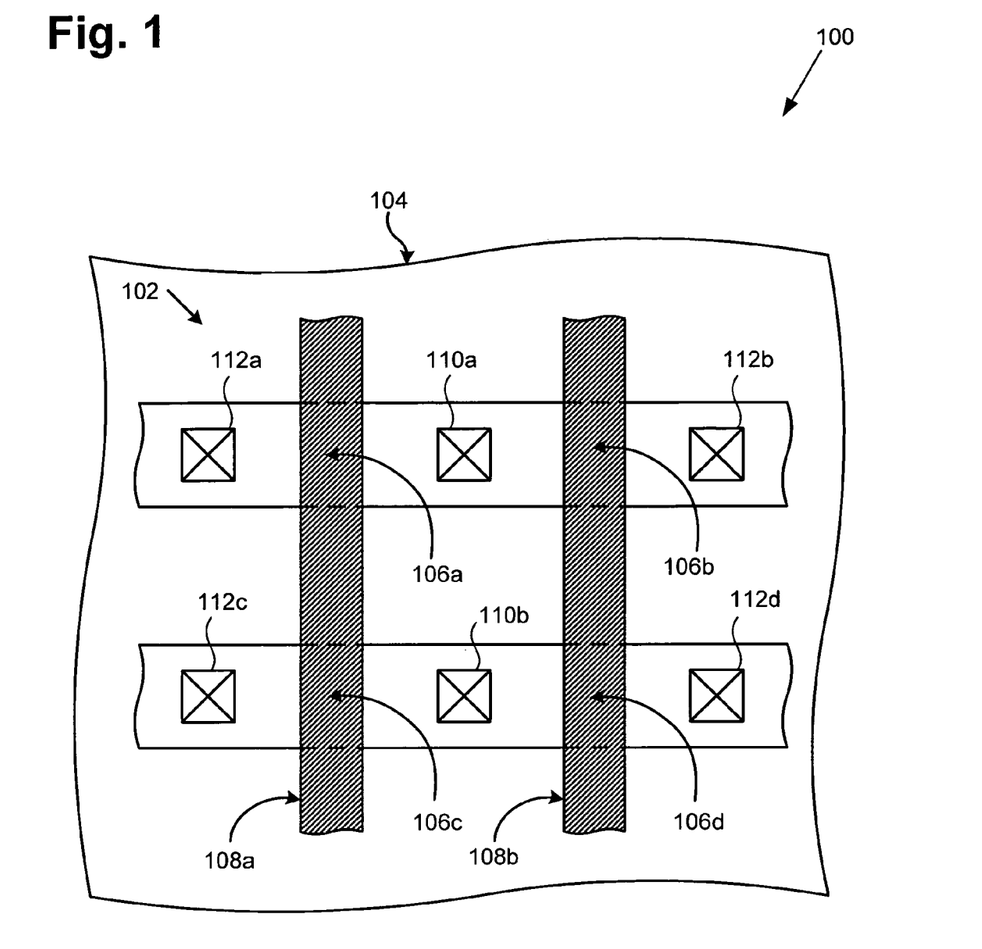
FIG. 1 shows a top view of an exemplary structure including an exemplary memory array, according to one embodiment of the present invention.

FIG. 1 shows a top view of structure 100 including memory array 102 comprising a plurality of p-channel GOI one transistor memory cells, according to one embodiment of the present invention, capable of overcoming the disadvantages of conventional semiconductor on insulator (SOI) one transistor memory cells described previously. Structure 100 includes memory array 102, which is formed on GOI substrate 104. Memory array 102, which can be a DRAM array, for example, includes memory cells 106a, 106b, 106c, and 106d, word lines 108a and 108b, source contacts 110a and 110b, and drain contacts 112a, 112b, 112c, and 112d. Each of memory cells 106a, 106b, 106c, and 106d can comprise a p-channel GOI one transistor memory cell implemented as a capacitorless DRAM cell, for example.

As shown in FIG. 1, word lines 108a and 108b are situated over GOI substrate 104. A portion of word line 108a forms a gate for each of memory cells 106a and 106c, and a portion of word line 108b forms a gate for each of memory cells 106b and 106d. A bulk semiconductor substrate (not shown in FIG. 1) supports a buried oxide (BOX) layer (also not shown in FIG. 1) underlying a germanium layer in which memory cells 106a, 106b, 106c, and 106d are formed. Contacts (not shown in FIG. 1) for word lines 108a and 108b can be provided at one side of memory array 102, and contacts (also not shown in FIG. 1) for the bulk semiconductor substrate can be provided at an opposite side of memory array 102, for example.

Also shown in FIG. 1, each of source contacts 110a and 110b can be coupled to ground and is connected to a source, which may be shared by adjacent memory cells as shown by structure 100. For example, source contact 110a is connected to a source that is shared by memory cells 106a and 106b. Further shown in FIG. 1, drain contacts 112a, 112b, 112c, and 112d are coupled to respective bit lines (not shown in FIG. 1). As will be more fully explained in following portions of the present disclosure, by utilizing a number of the invention's p-channel GOI one transistor memory cells, such as memory cells 106a, 106b, 106c, and 106d, memory array 102 provides an increased sensing margin at operational voltages compatible with voltages applied to logic devices.

Figure 2:
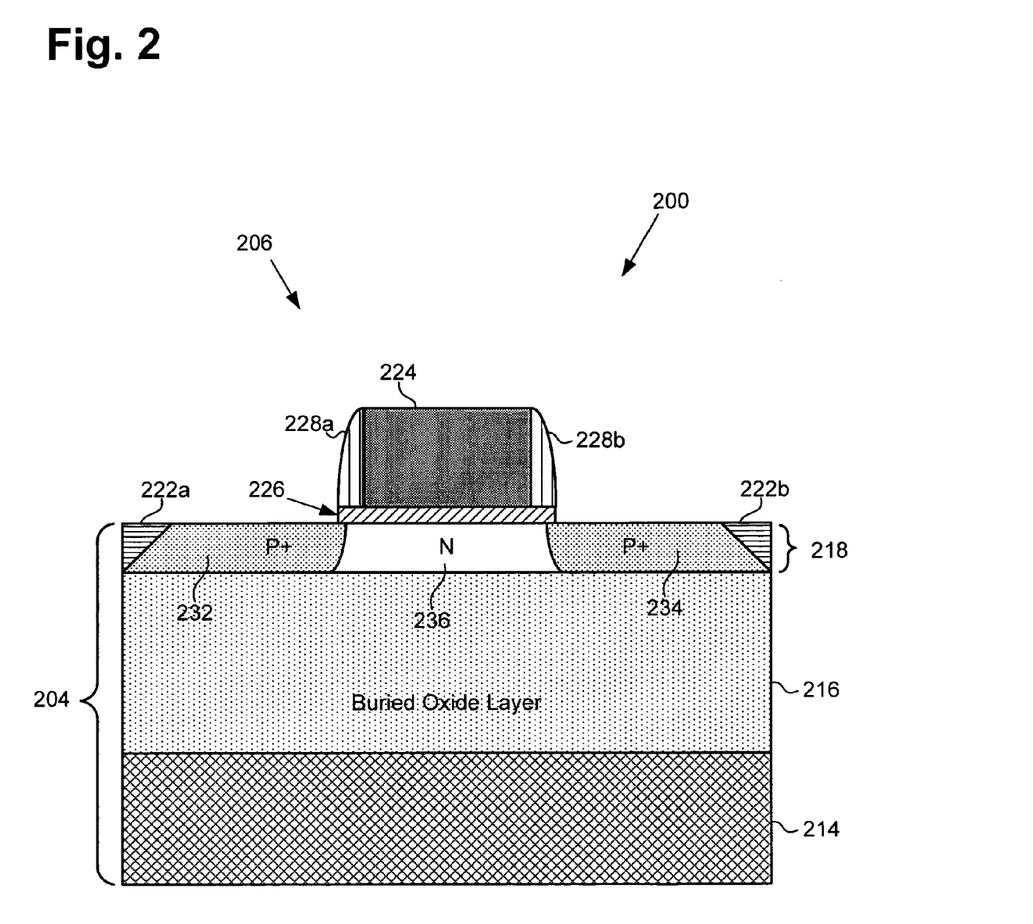
FIG. 2 shows a p-channel germanium on insulator (GOI) one transistor memory cell, according to one embodiment of the present invention.

Turning now to FIG. 2, FIG. 2 shows a cross-sectional view of structure 200 including p-channel GOI one transistor memory cell 206 (hereinafter "memory cell 206"), according to one embodiment of the present invention. Memory cell 206, in FIG. 2, is formed on GOI substrate 204, and may correspond to any of memory cells 106a, 106b, 106c, or 106d, formed on GOI substrate 104, in FIG. 1. Germanium on insulator substrate 204 includes bulk substrate 214, BOX layer 216, and germanium layer 218. As shown in FIG. 2, isolation regions 222a and 222b are formed in GOI substrate 204.

Memory cell 206, which is formed on GOI substrate 204, includes gate 224 formed over gate dielectric layer 226, spacers 228a and 228b, source region 232, drain region 234, and channel region 236. In the present embodiment, memory cell 206 comprises a GOI PMOS device, and may be implemented as a capacitorless DRAM cell, for example. The formation and operation of memory cell 206 will be further discussed with reference to FIGS. 3, 4A, 4B, 4C, and 4D.

Figure 3:
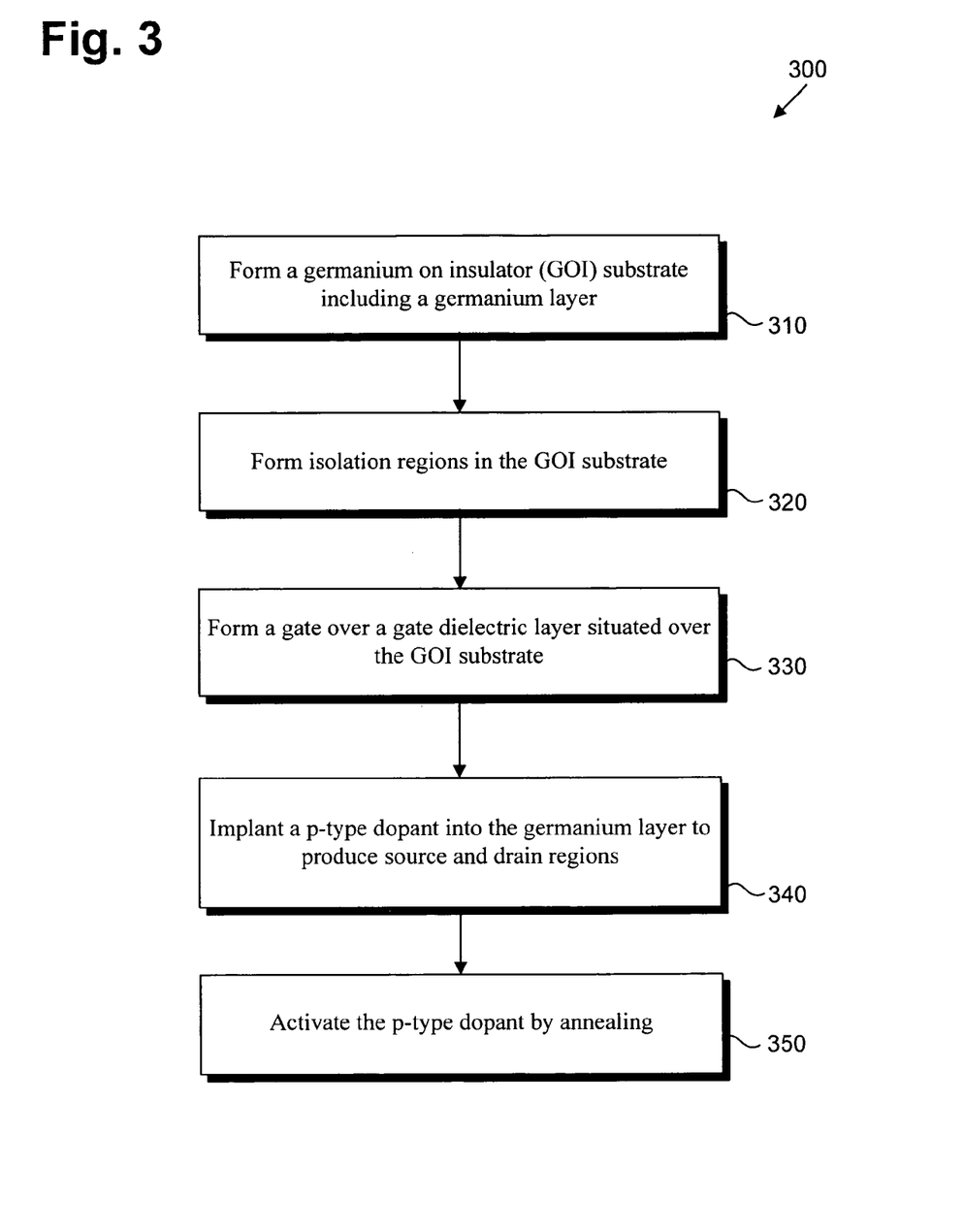
FIG. 3 shows a flowchart illustrating the steps taken to produce an embodiment of the present invention.

FIG. 3 shows a flowchart of steps implementing an exemplary method of producing a p-channel GOI one transistor memory cell, according to one embodiment of the present invention. Certain details and features have been left out of flowchart 300 that are apparent to a person of ordinary skill in the art. For example, a step may consist of one or more substeps or may involve specialized equipment, as known in the art. While steps 310 through 350 indicated in flowchart 300 are sufficient to describe one embodiment of the present invention, other embodiments of the invention may use steps different from those shown in flowchart 300, or may include more, or fewer steps.

Figure 4A:
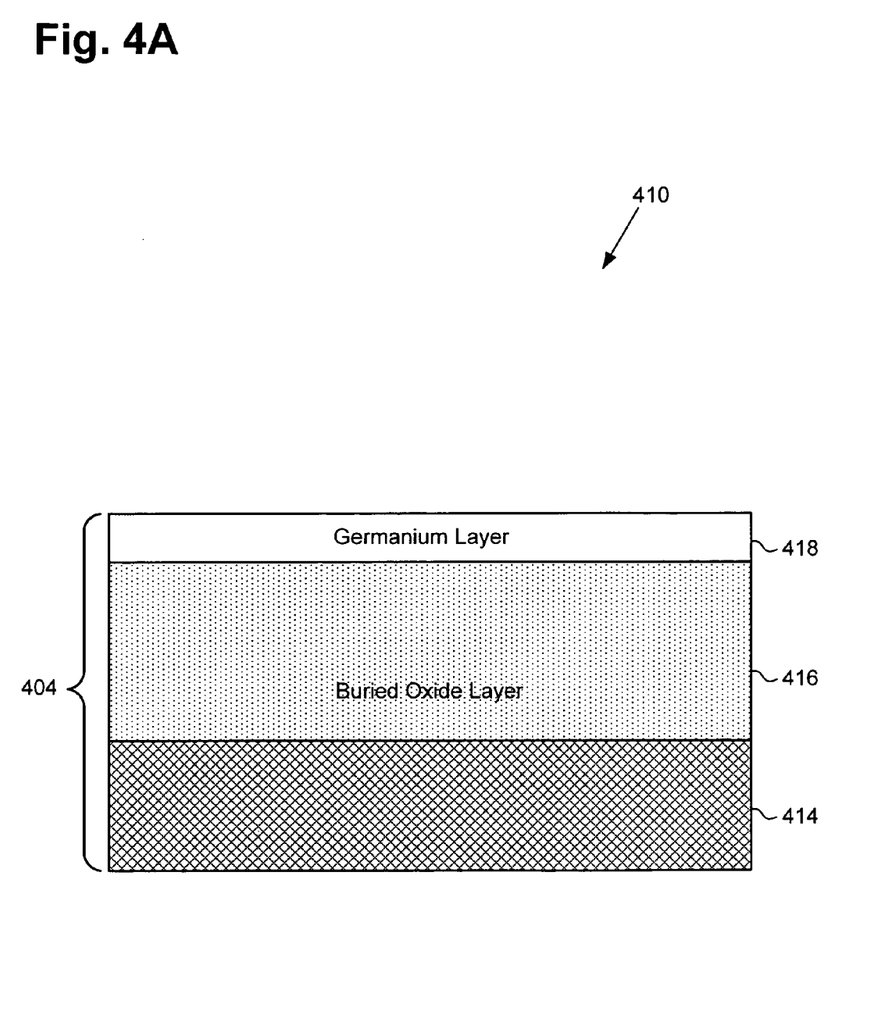
FIG. 4A is a cross-sectional view of a p-channel GOI one transistor memory cell, according to one embodiment of the present invention, at an intermediate stage in production.
Figure 4B:
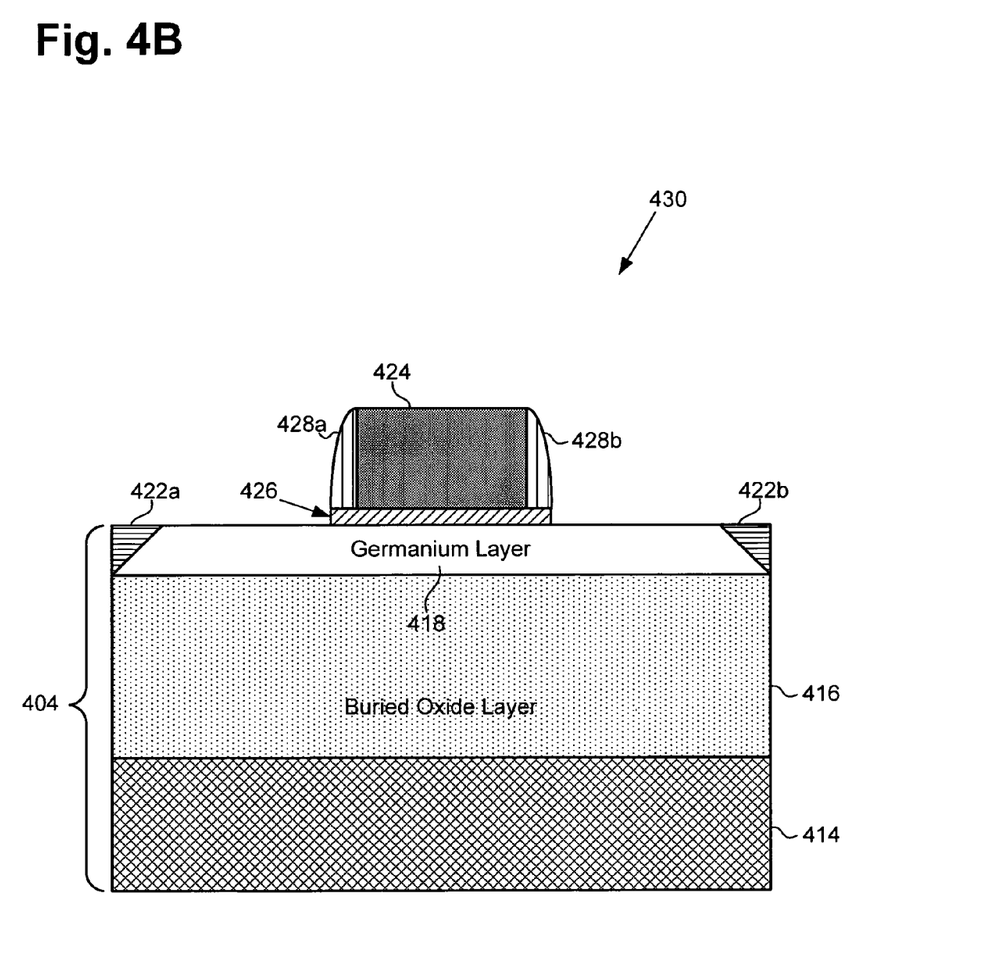
FIG. 4B is a cross-sectional view of a p-channel GOI one transistor memory cell, according to one embodiment of the present invention, at a second intermediate stage in production.
Figure 4C:
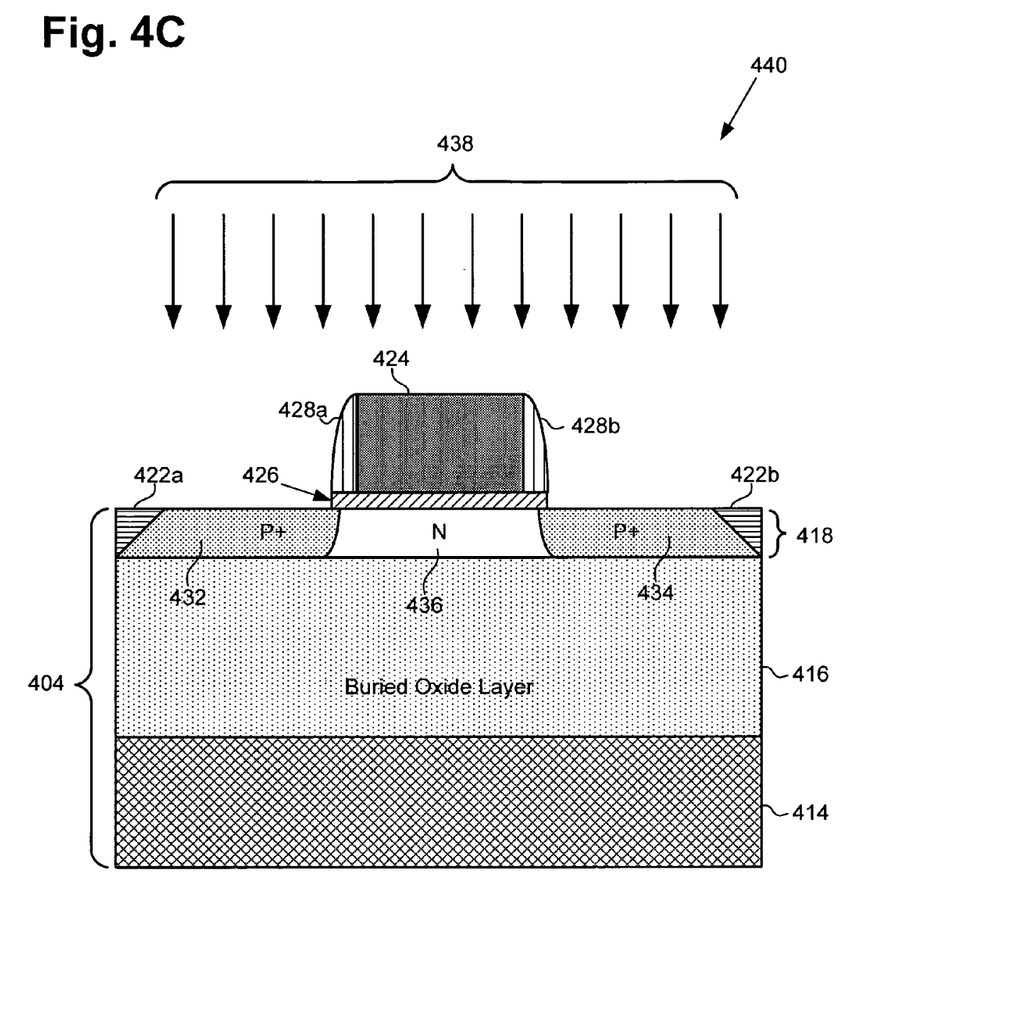
FIG. 4C is a cross-sectional view of a p-channel GOI one transistor memory cell, according to one embodiment of the present invention, at a dopant implantation stage of production.

Flowchart 300, in FIG. 3, will be described in combination with FIGS. 4A, 4B, and 4C. Structures 410, 430, and 440, shown respectively in FIGS. 4A, 4B, and 4C, show the result of performing steps 310 through 340 of flowchart 300. For example, structure 410 shows a GOI substrate after processing step 310, structure 430 shows 410 after processing steps 320 and 330, and so forth. It is noted that although formation of only a single p-channel GOI one transistor memory cell, such as a one transistor capacitorless DRAM cell, is specifically discussed herein to preserve brevity, multiple such memory cells may be formed in a GOI substrate in a memory array, such as a DRAM array, by utilizing the process of the present invention.

Referring to step 310 in flowchart 300 and FIG. 4A, step 310 comprises forming GOI substrate 404 including bulk substrate 414, BOX layer 416, and germanium layer 418. GOI substrate 404, bulk substrate 414, and BOX layer 416, correspond respectively to GOI substrate 204, bulk substrate 214, and BOX layer 216, in FIG. 2. As shown by structure 410, in FIG. 4A, BOX layer 416 is situated over bulk substrate 414, which can comprise silicon, and germanium layer 418 is situated over BOX layer 416. BOX layer 416 can comprise silicon dioxide, for instance, and may have a thickness in a range from approximately 20.0 nanometers (nm) to approximately 100.0 nm, for example.

Germanium layer 418, in FIG. 4A, which corresponds to germanium layer 218 in FIG. 2, can comprise pure germanium and may be formed to a thickness of, from approximately 10.0 nm to approximately 30.0 nm, for example. In one embodiment, germanium layer 418 may be formed relaxed. In other embodiments, however, germanium layer 418 may comprise strained germanium. Following formation of GOI substrate 404 in step 310 of flowchart 300, isolation regions may be formed in GOI substrate 404 in following step 320.

Moving on to step 330 of flowchart 300 and FIG. 4B, step 330 comprises forming gate 424 over gate dielectric layer 426 situated over GOI substrate 404. Structure 430, in FIG. 4B, shows isolation regions 422a and 422b formed in GOI substrate 404 in step 320 of flowchart 300. Isolation regions 422a and 422b correspond respectively to isolations regions 222a and 222b, in FIG. 2. Isolation regions 422a and 422b may comprise silicon dioxide and can be, for example, shallow trench isolation (STI) regions. Also shown in structure 430 are gate 424, gate dielectric layer 426, and spacers 428a and 428b, corresponding respectively to gate 224, gate dielectric layer 226, and spacers 228a and 228b, in FIG. 2.

Gate dielectric layer 426 is situated over germanium layer 418, and may comprise, for example, hafnium silicon oxynitride (HfSiON), hafnium dioxide (HfO$_2$), germanium oxynitride (GeON), hafnium germanium oxynitride (HfGeON), or other suitable high-k material. Gate dielectric layer 426 may be formed on an interface layer of germanium nitride formed on germanium layer 418, for example, by nitriding germanium layer 418 in plasma at approximately 300° C. The equivalent oxide thickness resulting from formation of gate dielectric layer 426 may range from approximately 0.5 nm to approximately 2.0 nm, for example.

Gate 424 can be utilized to determine a yet to be formed channel region in germanium layer 418, and may comprise any suitable p-type gate material, such as nickel (NI), platinum (Pt), ruthenium Ru, or tantalum nitride (TaN), for example. Spacers 428a and 428b are situated adjacent to opposite sides of gate 424 and, in the embodiment of FIG. 4B, are also situated over gate dielectric layer 426. Spacers 428a and 428b can comprise nitride or other suitable dielectric material. It is noted that one of the advantages provided by the present invention is that the gate stack utilized for formation of the present invention's p-channel GOI one transistor memory cell may be substantially the same as those utilized in the formation of logic gates. This is the case because the present invention's p-channel GOI one transistor memory cell enables production of sufficiently large sensing margins at bias voltages compatible with the operational voltages used by logic devices.

Continuing with step 340 of flowchart 300 and FIG. 4C, step 340 of flowchart 300 comprises implanting a p-type dopant into germanium layer 418, to produce source region 432 and drain region 434. As shown by structure 440 of FIG. 4B, implant step 340 comprises exposure of germanium layer 418 to p-type implant 438. Shielding of a region underlying gate 424 from p-type implant 438, due to the presence of gate 424, determines channel region 436. Channel region 436 corresponds to channel region 236, shown in FIG. 2.

Implantation of p-type implant 438 into germanium layer 418 during implant step 340 produces source region 432 adjacent to channel region 436, and drain region 434 adjacent to channel region 436. Source region 432 and drain region 434, corresponding respectively to source region 232 and drain region 234, in FIG. 2, may comprise heavily doped p-type regions, for example, implanted with boron, or other suitable p-type implant material. In one embodiment, for example, p-type implant 438 can implant boron at an ion concentration in a range from approximately $2.0 \times 10^{14}/cm^2$ to approximately $2.0 \times 10^{15}/cm^2$, at an implantation energy in a range from approximately 6.0 keV to approximately 18.0 keV.

After implantation in step 340 of flowchart 300, the p-type dopant may be activated by annealing in step 350. Activation may be performed by rapid thermal anneal, in a temperature range from 400.0° C. to 700.0° C. for thirty to sixty seconds, for example. Alternatively, activation may be produced by means of laser annealing. In addition to activating the p-type dopant implanted in step 340, annealing serves to repair damage to the crystalline structure of germanium layer 418 caused by the p-type implant. In a subsequent step, not shown in flowchart 300, nickel germanide may be utilized to form electrical contacts on germanium layer 418, in a manner known in the art.

Figure 4D:
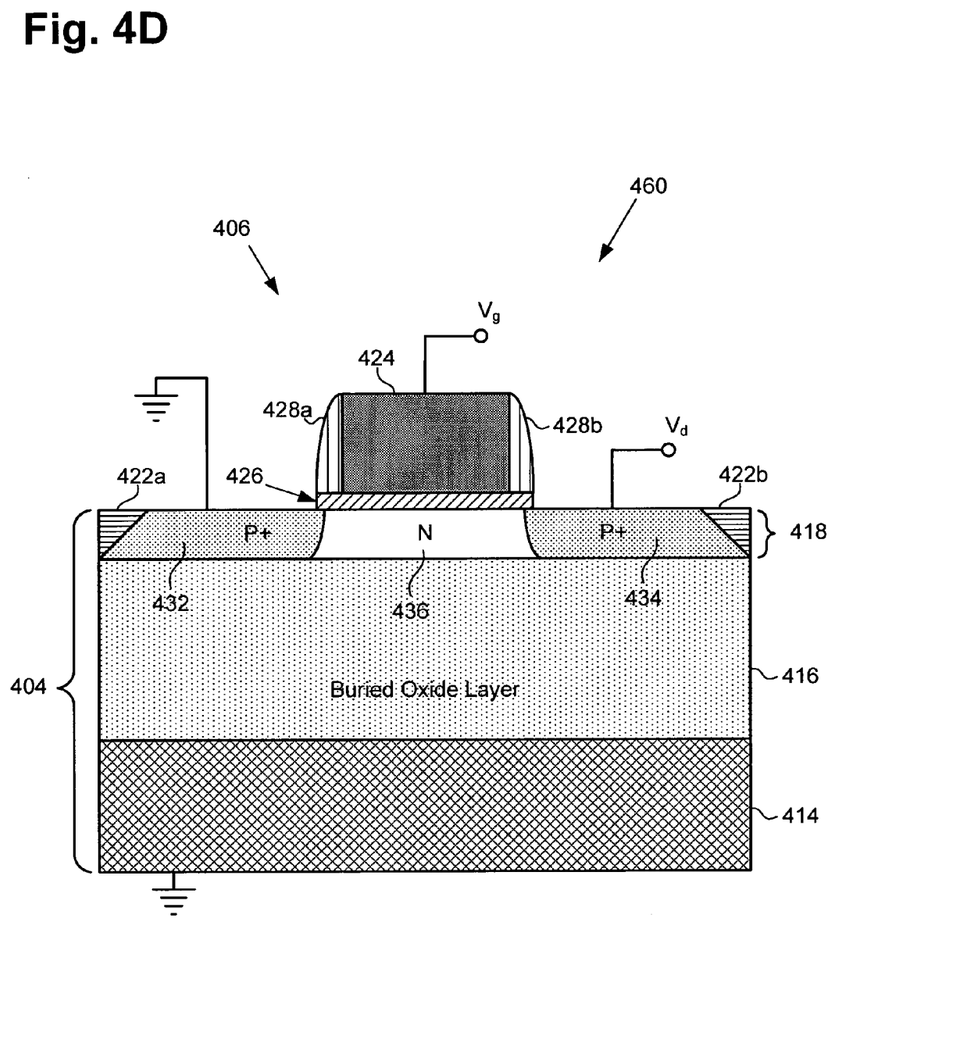
FIG. 4D is a cross-sectional view of an operational p-channel GOI one transistor memory cell, according to one embodiment of the present invention.

The operation of a p-channel GOI one transistor memory cell, according to one embodiment of the present invention, will now be discussed with reference to FIG. 4D. FIG. 4D shows a cross-sectional view of operational p-channel GOI one transistor memory cell 406 (hereinafter "memory cell 406"), corresponding to memory cell 206 in FIG. 2. In addition to the previously recited elements of memory cell 406, described in relation to FIGS. 4A, 4B, and 4C, FIG. 4D shows drain biasing voltage $V_d$, and gate biasing voltage $V_g$, as well as source region 432 and bulk substrate 414 being grounded.

The memory state of memory cell 406 may be described in terms of the minority charge carriers stored in channel region 436. Application of suitable biasing voltages to drain region 434 and gate 424 activate, or turn on, memory cell 406. Impact ionization occurring at the drain/channel junction result in the flow of majority carriers into drain region 434, and the sequestering of minority carriers in the channel region. Changes in the concentration of minority carriers held in the channel region can be sensed by measuring corresponding changes in drain current or threshold voltage. Using conventional approaches to producing a silicon on insulator one transistor memory cell, only the NMOS implementation is practicable, due to the markedly lower ionization coefficient for positive charge carrying holes in silicon. Even in conventionally successful NMOS implementations, however, the ionization coefficient for electrons in silicon is sufficiently low to render the sensing margins achievable using those devices too low.

As described previously, compensation schemes for improving the sensing margins of conventional NMOS silicon on insulator one transistor memory cells rely on complicated sensing circuitry, elevated biasing voltages, or both. As a result, conventional implementations impose disadvantages associated both with production cost and reliability. The present inventor has realized that because of the substantially higher ionization coefficients seen in germanium, when compared to silicon, implementation of a GOI device as a one transistor memory cell may produce significant performance advantages. Fabrication challenges related to relatively low saturation levels for n-type implants in germanium, as well as source and drain lengthening due to a nearly unavoidable phenomenon of effective n-type doping by ambient hydrogen during annealing, however, make implementation of an NMOS GOI memory cells undesirably complex.

Instead, the present inventor has discovered that germanium, which, unlike silicon, displays similarly high ionization coefficients for holes as well as electrons, may be advantageously utilized to produce a superior one transistor memory cell in a PMOS implementation. Thus, according to one embodiment of the present invention, shown in FIG. 4D, operation may proceed as follows: To write a logic "1" to memory cell 406, for example, drain biasing voltage $V_d$ can be set from approximately −0.8 V to approximately −1.2 V, gate biasing voltage $V_g$ can be set to approximately −0.6 V, and the voltage of source region 434 and bulk substrate 414 may be set to approximately 0.0 volts (ground voltage). Even with these nominal applied voltages, the relatively high ionization coefficient for holes seen in germanium results in significant impact ionization at the junction of channel region 436 and drain region 434.

As a result of impact ionization, electrons are generated in channel region 436 and held there, changing the threshold voltage and the drain current. The change in threshold voltage of gate 424 can be sensed by measurement during a read operation. If the absolute value of the threshold voltage as measured during the read operation is greater than a value prior to writing to (i.e. programming) memory cell 406, the higher absolute value of the threshold voltage can be utilized to designate a logic "1" at memory cell 406. Alternatively, a higher absolute value of the threshold voltage may also be utilized to designate a logic "0" at memory cell 406.

To write a logic "0" to memory cell 406, for example, drain biasing voltage $V_d$ can be set to approximately 0.5 V, gate biasing voltage $V_g$ can be set to approximately −0.6 V, and the voltage of source region 434 and bulk substrate 414 may be set to approximately 0.0 volts (ground voltage). As a result, electrons are removed from the channel region when compared to the logic "1" state, and the drain current and the threshold voltage correspondingly altered. A change in the absolute value of the threshold voltage can be sensed by a measurement during a read operation. If the absolute value of threshold voltage as measured during the read operation is lower than the absolute value prior to writing to (i.e. programming) memory cell 406, the lower absolute value of the threshold voltage can be utilized to designate a logic "0" at memory cell 406. Again, alternatively, a lower absolute value of the threshold voltage may also be utilized to designate a logic "1" at memory cell 406.

Figure 5:
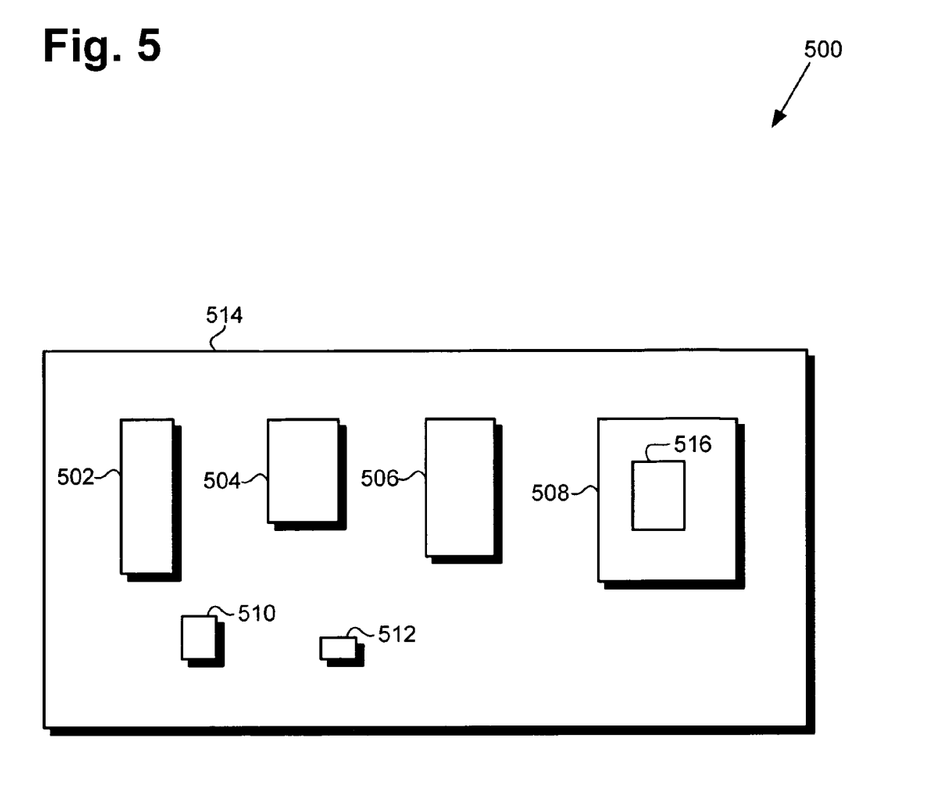
FIG. 5 is a diagram of an exemplary electronic system including an exemplary chip or die utilizing a memory array comprising a plurality of p-channel GOI one transistor memory cells in accordance with one embodiment of the present invention.

Turning now to FIG. 5, FIG. 5 illustrates a diagram of an exemplary electronic system including an exemplary chip or die utilizing a memory array comprising a plurality of p-channel GOI one transistor memory cells in accordance with one embodiment of the present invention. Electronic system 500 includes exemplary modules 502, 504, and 506, integrated circuit (IC) chip or semiconductor die 508, discrete components 510 and 512, residing in and interconnected through circuit board (PCB) 514. In one embodiment, electronic system 500 may include more than one printed circuit board. IC chip 508 includes circuit 516, which can comprise a memory, such as memory array 102, in FIG. 1, including a number of the invention's p-channel GOI one transistor memory cells, such as memory cell 206, in FIG. 2.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, a radio frequency (RF) receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is mounted on circuit board 514 and can be, for example, any chip utilizing an embodiment of the invention's p-channel GOI one transistor memory cell. In one embodiment, IC chip 508 may not be mounted on circuit board 514, and may be interconnected with other modules on different circuit boards. As stated above, circuit 516 is situated in IC chip 508 and may comprise an embodiment of the invention's p-channel GOI one transistor memory cell. Further shown in FIG. 5, discrete components 510 and 512 are mounted on circuit board 514 and can each be, for example, a discrete filter, such as one including a bulk acoustic wave (BAW) or surface acoustic wave (SAW) filter or the like, a power amplifier or an operational amplifier, a semiconductor device, such as a transistor or a diode or the like, an antenna element, an inductor, a capacitor, or a resistor.

Electronic system 500 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

By utilizing the higher ionization coefficient for holes displayed by germanium, the present invention enables achievement of a significantly increased difference in threshold voltage between a logic "0" and a logic "1" compared to a conventional one transistor memory cell, and does so using significantly lower biasing voltages. Consequently, the invention's p-channel GOI one transistor memory cell can achieve a greater sensing margin than a conventional n-channel silicon on insulator one transistor memory cell. Moreover the present invention achieves that greater sensing margin at biasing voltages compatible with the operating voltages used by logic devices.

As a result of its described performance advantages, the present invention's p-channel GOI one transistor memory cell requires less complicated, i.e., simpler, sensing circuitry compared to a conventional one transistor memory cell, which advantageously reduces manufacturing cost. Also, because the present invention's p-channel GOI one transistor memory cell achieves an increased sensing margin while utilizing lower voltages compared to a conventional n-channel silicon on insulator one transistor memory cell, it consumes less power. Further, the ability to operate at voltages compatible with logic devices eliminates the need for the elaborate and redundant higher voltage delivery architecture required in systems utilizing conventional one transistor memory cells.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a p-channel GOI one transistor memory cell has been described.

The invention claimed is:

1. A p-channel germanium on insulator (GOI) one transistor memory cell comprising:
    a buried oxide (BOX) layer formed over a bulk substrate;
    a gate formed over a gate dielectric layer situated over a germanium layer formed over said BOX layer;
    a source region formed in said germanium layer adjacent to a channel region underlying said gate and overlaying said BOX layer, and a drain region formed in said germanium layer adjacent to said channel region;
    said source region and said drain region having been only heavily implanted therein with a p-type dopant, thereby resulting in said p-channel GOI One transistor memory cell;
    wherein said p-channel GOI one transistor memory cell is configured to perform a write operation for a drain biasing voltage having absolute value less than 1.3 V.

2. The p-channel GOI one transistor memory cell of claim 1 implemented as a capacitorless dynamic random access memory (DRAM) cell.

3. The p-channel GOI one transistor memory cell of claim 1, wherein said germanium layer comprises strained germanium.

4. The p-channel GOI one transistor memory cell of claim 1, configured to perform a write operation for a gate biasing voltage having absolute value less than 0.7 V, said source region and said bulk substrate being grounded.

5. The p-channel GOI one transistor memory cell of claim 1, wherein said germanium layer has a thickness in a range from approximately 10 nm to approximately 30 nm.

6. The p-channel GOI one transistor, memory cell of claim 1, wherein said source region and said drain. region are formed by boron implantation with an ion concentration, in a range from approximately $2.0 \times 10^{14}/cm^2$ to approximately $2.0 \times 10^{15}/cm^2$, at an implantation energy in a range from approximately 6.0 keV to approximately 18.0 keV.

7. The p-channel GOI one transistor memory cell of claim 1, wherein said gate dielectric layer comprises hafnium silicon oxynitride (HfSiON).

8. A semiconductor die having fabricated thereon a memory array including a plurality of p-channel germanium on insulator (GOI one transistor memory cells, each of said plurality of p-channel GOI one-transistor memory cells comprising:
 a buried oxide (BOX) layer formed over a bulk substrate;
 a gate formed over a gate dielectric layer situated over a germanium layer formed over said BOX layer;
 a source region formed in said germanium layer adjacent to a channel region underlying said gate and overlaying said BOX layer, and a drain region formed in said germanium layer adjacent to said channel region;
 said source region and said drain region having been only heavily implanted therein with a p-type dopant;
 wherein each of the plurality of p-channel GOI one transistor memory cells is configured to perform a write operation for a drain biasing voltage having absolute value less than 1.3 V.

9. The semiconductor die of claim 8, wherein each of the plurality of p-channel GOI one transistor memory cells is implemented as a capacitorless dynamic random access memory (DRAM) cell.

10. The semiconductor die of claim 8, wherein said germanium layer comprises strained germanium.

11. The semiconductor die of claim 8, wherein each of the plurality of p-channel GOI one transistor memory cells is configured to perform a write operation for a gate biasing voltage having absolute value less than 0.7 V, said source region and said bulk substrate being grounded.

12. The semiconductor die of claim 8, wherein said germanium layer has a thickness in a range from approximately 10 nm to approximately 30 nm.

13. The semiconductor die of claim 8, wherein said source region and said drain region are formed by boron implantation with an ion concentration in a range from approximately $2.0 \times 10^{14}/cm^2$ to approximately $2.0 \times 10^{15}/cm^2$, at an implantation energy in a range from approximately 6.0 keV to approximately 18.0 keV.

14. The semiconductor die of claim 8, wherein said semiconductor die is utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

* * * * *